(12) United States Patent
Seki et al.

(10) Patent No.: US 7,888,300 B2
(45) Date of Patent: Feb. 15, 2011

(54) CLEANING LIQUID FOR SEMICONDUCTOR DEVICE AND CLEANING METHOD

(75) Inventors: Hiroyuki Seki, Kanagawa (JP); Katsuyuki Nukui, Kanagawa (JP); Tadashi Inaba, Kanagawa (JP); Hideo Fushimi, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/585,486

(22) Filed: Sep. 16, 2009

(65) Prior Publication Data

US 2010/0160200 A1 Jun. 24, 2010

(30) Foreign Application Priority Data

Dec. 22, 2008 (JP) ............................. 2008-325827

(51) Int. Cl.
*C11D 3/16* (2006.01)
(52) U.S. Cl. .................. 510/109; 510/134; 510/176; 510/435
(58) Field of Classification Search ............. 510/109, 510/134, 176, 421, 435
See application file for complete search history.

(56) References Cited

U.S. PATENT DOCUMENTS

| 5,185,235 A | | 2/1993 | Sato et al. | |
|---|---|---|---|---|
| 5,234,506 A | * | 8/1993 | Winston et al. | 134/40 |
| 5,279,771 A | | 1/1994 | Lee | |
| 5,466,389 A | * | 11/1995 | Ilardi et al. | 510/175 |
| 2005/0263743 A1 | * | 12/2005 | Lee | 252/364 |
| 2007/0099810 A1 | | 5/2007 | Matsunaga et al. | |
| 2008/0200361 A1 | * | 8/2008 | Walker et al. | 510/175 |
| 2009/0137439 A1 | * | 5/2009 | Dinh et al. | 510/170 |

FOREIGN PATENT DOCUMENTS

| JP | 62-049355 | 3/1987 |
|---|---|---|
| JP | 64-042653 | 2/1989 |

* cited by examiner

*Primary Examiner*—Ling-Siu Choi
(74) *Attorney, Agent, or Firm*—Jean C. Edwards, Esq.; Akerman Senterfitt

(57) ABSTRACT

The invention provides a cleaning liquid for semiconductor devices which is capable of removing deposits on a surface of an object to be cleaned including a photoresist, an antireflective film, an etching residue and an ashing residue at a low temperature in a short period of time with reduced environmental burdens and without causing corrosion of an interlayer dielectric film, a metal, a metal nitride, and an alloy in the object to be cleaned. The cleaning liquid for semiconductor devices according to the invention contains a reducing agent and a surfactant and has a pH of 10 to 14.

15 Claims, No Drawings

CLEANING LIQUID FOR SEMICONDUCTOR DEVICE AND CLEANING METHOD

This application claims priority to Japanese Patent Application No. 2008-325827, filed Dec. 22, 2008, the contents of which are incorporated herein by reference in their entirety. In addition, the entire contents of all patents and references cited in this specification are also incorporated herein by reference.

BACKGROUND OF THE INVENTION

The present invention relates to a cleaning liquid for semiconductor devices and a cleaning method. More specifically, the present invention relates to a process of manufacturing semiconductor devices and particularly to a cleaning liquid for removing a photoresist, an etching residue, an antireflective film, and an ashing residue which are present on a substrate in the whole process of semiconductor device manufacture, as well as a method of cleaning semiconductor devices using the cleaning liquid.

Semiconductor devices such as CCDs and memories are manufactured by forming fine electronic circuit patterns on substrates using photolithographic technology. Specifically, such semiconductor devices are manufactured by a process which involves forming on a substrate a laminate film including a film of a metal (e.g., copper) serving as a wiring material, an interlayer dielectric film and an antireflective film, applying a resist film onto the laminate film and carrying out a photolithographic step and a dry etching step. The photoresist and the antireflective film remaining following the photolithographic step are subjected to dry ashing. Thereafter, a treatment is commonly performed in which residues (e.g., etching residue and ashing residue) that were generated by the dry etching step and the dry ashing step and remain on the wiring material and interlayer dielectric film material are removed with a cleaning liquid.

Increased performance of semiconductor devices has created a need in recent years for further miniaturization and higher manufacturing speeds. Under the circumstances, shortening of the cleaning time in the process of manufacturing the semiconductor devices and improvement of the cleaning technology are important issues. For example, interlayer dielectric films made of low-k materials are used in order to improve the performance of the semiconductor devices. In cases where the low-k materials have pores due to a decrease in the k value, the presence of the pores may increase the contact area between the cleaning liquid and the low-k materials during the cleaning step, thus causing the low-k materials to be etched by the cleaning liquid during the cleaning step. This brings about a change in the shape of the device wiring, which is not preferable for the device performance.

With the thinner wiring and higher performance of the semiconductor devices, the manufacturing process has recently shifted to one in which no dry ashing step is carried out or a dry ashing step is moderately carried out in order to reduce damage to the interlayer dielectric films made of wiring materials and in particular low-k materials during the manufacturing process. Therefore, a cleaning liquid capable of thoroughly removing the photoresist and the antireflective film without performing the dry ashing step or the like has been desired.

For example, cleaning liquids comprising a mixture of an alkanolamine and an organic solvent have conventionally been proposed for the semiconductor device-cleaning liquid for use in removing the above-described photoresist, antireflective film, etching residue and ashing residue (see JP 62-49355 A and JP 64-42653 A). U.S. Pat. No. 5,279,771 discloses a cleaning liquid comprising an alkanolamine, hydroxylamine, catechol and water.

U.S. Pat. No. 5,185,235 discloses a cleaning liquid comprising an alcoholic solvent, a halogenated solvent and an organic quaternary ammonium salt.

U.S. Pat. No. 5,466,389 discloses a cleaning liquid comprising water, tetramethyl ammonium hydroxide, hydrogen peroxide, and a nonionic surfactant.

US 2007/099810 A1 discloses a cleaning liquid comprising sodium hydroxide or potassium hydroxide, a water-soluble organic solvent, and a corrosion inhibitor of a group IX or XI metal.

SUMMARY OF THE INVENTION

However, the inventors of the present invention have made a study about the foregoing cleaning liquids and found the problems described below.

(1) The cleaning liquids described in JP 62-49355 A, JP 64-42653 A and U.S. Pat. No. 5,279,771 suffer from insufficient removal of the antireflective film such as an organosiloxane antireflective film and in addition, corrosion of copper and Ti (titanium) used for the wiring material.

(2) With the cleaning liquid described in U.S. Pat. No. 5,185,235, corrosion of copper and Ti (titanium) used for the wiring material is slight, but the photoresist and the antireflective film (e.g., organosiloxane antireflective film) are not removed sufficiently.

(3) The cleaning liquid described in U.S. Pat. No. 5,466,389 requires an elevated temperature and an extended period of time to remove the photoresist and the antireflective film (e.g., organosiloxane antireflective film) and is therefore not sufficient for device manufacture aiming at a higher throughput.

(4) With the cleaning liquid described in US 2007/099810 A1, high cleaning performance can be obtained in a relatively short period of time, but the liquid temperature used is not low enough, nor is the required period of time short. Benzotriazoles used for the corrosion inhibitor are low in biodegradability, in other words, have high environmental burdens, thus involving enormous costs in wastewater treatment or other environmental equipment.

As described above, the photoresist residue, etching residue, antireflective film or ashing residue cannot be sufficiently removed by the conventional cleaning liquids. Even if such residues could be removed, the cleaning process would require a long period of time, or the low-k material contained in a semiconductor device and the wiring metal would be etched, or the environmental burdens would be increased because of the use of a heterocycle-containing metal corrosion inhibitor.

Accordingly, an object of the present invention is to provide a cleaning liquid for semiconductor devices which is capable of removing deposits on a surface of an object to be cleaned (e.g., a photoresist, an etching residue, an antireflective film and an ashing residue) with reduced environmental burdens and without causing corrosion of a metal, a metal nitride, an alloy and an interlayer dielectric film in the object to be cleaned. Another object of the invention is to provide a method of cleaning semiconductor devices using the cleaning liquid.

The inventors of the present invention have made intensive studies and as a result found that the above objects are achieved by the characteristic features described in (1) to (12) below.

(1) A cleaning liquid for semiconductor devices comprising: a reducing agent; and a surfactant, wherein the cleaning liquid has a pH of 10 to 14.
(2) The cleaning liquid for semiconductor devices according to (1), wherein the reducing agent is hydroxylamine or its derivative.
(3) The cleaning liquid for semiconductor devices according to (1), wherein the reducing agent is at least one compound selected from the group consisting of dithionites, disulfites, sulfites, thiosulfates, dithionates, and trithionates.
(4) The cleaning liquid for semiconductor devices according to any one of (1) to (3), further comprising an inorganic alkaline compound or a quaternary ammonium hydroxide represented by general formula (1):

General formula (1)

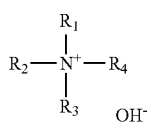

(wherein $R_1$ to $R_4$ each independently represent an alkyl group having 1 to 6 carbon atoms, a hydroxyalkyl group having 1 to 6 carbon atoms, a benzyl group or an aryl group).
(5) The cleaning liquid for semiconductor devices according to (4), wherein the inorganic alkaline compound is at least one compound selected from the group consisting of lithium hydroxide, sodium hydroxide, potassium hydroxide, rubidium hydroxide, and cesium hydroxide.
(6) The cleaning liquid for semiconductor devices according to any one of (1) to (5), wherein the surfactant is a cationic surfactant or a nonionic surfactant.
(7) The cleaning liquid for semiconductor devices according to (6), wherein the cationic surfactant is a quaternary ammonium salt surfactant or an alkylpyridium surfactant.
(8) The cleaning liquid for semiconductor devices according to (6), wherein the nonionic surfactant is at least one selected from the group consisting of a polypropylene oxide polyethylene oxide surfactant, a polyalkylene oxide distyrenated phenyl ether surfactant, a polyalkylene oxide alkyl phenyl ether surfactant, a polyalkylene oxide tribenzyl phenyl ether surfactant, an acetylene polyalkylene oxide surfactant, and a polyalkylene oxide alkyl ether surfactant.
(9) The cleaning liquid for semiconductor devices according to any one of (1) to (8), wherein the cleaning liquid contains an ether solvent in an amount of 0.0001 to 0.5 wt % with respect to a total amount of the cleaning liquid.
(10) A semiconductor device-cleaning method comprising: cleaning a semiconductor device using the cleaning liquid for semiconductor devices according to any one of (1) to (9).
(11) A semiconductor device-cleaning method comprising: a cleaning step for cleaning a semiconductor device using the cleaning liquid for semiconductors according to any one of (1) to (9) after a dry etching step.
(12) The semiconductor device-cleaning method according to (10) or (11), wherein the semiconductor device is one having an interlayer dielectric film with a dielectric constant k of 3.0 or less.

The cleaning liquid of the present invention can remove deposits on the surface of an object to be cleaned (e.g., a photoresist, an etching residue, an antireflective film and an ashing residue) with reduced environmental burdens and without causing corrosion of a metal, a metal nitride, an alloy and an interlayer dielectric film material included in the object to be cleaned. The cleaning liquid for semiconductor devices (hereinafter referred to simply as "cleaning liquid") of the present invention is capable of removing deposits without containing a heterocycle-containing metal corrosion inhibitor.

DETAILED DESCRIPTION OF THE INVENTION

The etching residue as used in the present invention refers to a by-product formed by etching, which includes a photoresist-derived organic residue, a silicon-containing residue, and a metal-containing residue. The ashing residue as used in the present invention refers to a by-product formed by ashing, which includes a photoresist-derived organic residue, a silicon-containing residue, and a metal-containing residue.

The cleaning liquid of the present invention is one that may be used to manufacture semiconductor devices. The cleaning liquid contains a reducing agent and a surfactant and has a pH of 10 to 14. Specific embodiments are described below.

(Reducing Agent)

The cleaning liquid of the present invention contains a reducing agent. The reducing agent that may be used in the present invention should be a compound having a reducing action and illustrative examples include sodium borohydride and its ammonium salt, lithium salt, sodium salt and potassium salt; sodium phosphinate, sodium phosphonate, sodium hydrogen phosphonate, sodium diphosphonate, and their ammonium salts and potassium salts; and hydrazine and its derivatives (e.g., phenylhydrazine, benzylhydrazine, ethylhydrazine and N,N-dimethylhydrazine).

Examples of the reducing agent that may be preferably used in the present invention include hydroxylamine and hydroxylamine derivatives. Use of such compounds further improves the removability of the residues while further suppressing the corrosion of the substrate and dielectric film. Examples of the hydroxylamine derivatives include O-methylhydroxylamine, O-ethylhydroxylamine, N-methylhydroxylamine, N,N-dimethylhydroxylamine, N,O-dimethylhydroxylamine, N-ethylhydroxylamine, N,N-diethylhydroxylamine, N,O-diethylhydroxylamine, O,N,N-trimethylhydroxylamine, N,N-dicarboxyethylhydroxylamine, and N,N-disulfoethylhydroxylamine.

Of these, N,N-diethylhydroxylamine, hydroxylamine, N,N-dicarboxyethylhydroxylamine, and N,N-disulfoethylhydroxylamine are preferred. The hydroxylamine and the hydroxylamine derivatives may be in the form of their salts and illustrative examples thereof include hydroxylamine sulfate, hydroxylamine hydrochloride and hydroxylamine nitrate.

Other preferred examples of the reducing agent that may be used in the present invention include oxo acid salts of sulfur (sulfur-containing oxo acid salts) such as dithionites, disulfites, sulfites, thiosulfates, dithionates, and trithionates. More specific examples include sodium dithionite ($Na_2S_2O_4$), sodium disulfite ($Na_2S_2O_5$), sodium sulfite ($Na_2SO_3$), sodium hydrogen sulfite ($NaHSO_3$), sodium thiosulfate ($Na_2S_2O_2$), sodium dithionate ($Na_2S_2O_6$) and sodium trithionate, and ammonium improves the removability of the residues while further suppressing the corrosion of the substrate and dielectric film.

Of the foregoing reducing agents, hydroxylamine derivatives and sulfites are more preferably used and hydroxylamine sulfate, diethylhydroxylamine, sodium sulfite and ammonium sulfite are even more preferably used. The reducing agents may be used singly or in combination of two or more. Commercial products may be used for the reducing agent.

The reducing agent is preferably incorporated in an amount of 0.01 to 20 wt %, more preferably 0.1 to 10 wt % and even more preferably 0.1 to 5 wt % with respect to the total weight of the cleaning liquid. A reducing agent content within the above-defined numerical range is preferred because etching of a metal or other material is suitably suppressed.

[Surfactant]

The cleaning liquid of the present invention contains a surfactant. Exemplary surfactants that may be used include a nonionic surfactant, an anionic surfactant, a cationic surfactant, and an ampholytic surfactant.

The surfactant that may be used in the present invention is preferably a nonionic surfactant, because its addition enables the viscosity of the cleaning liquid to be adjusted while improving the wettability with respect to the object to be cleaned, and both of the removability of the residues and the resistance to corrosion of the substrate and the dielectric film are more excellent.

Examples of the nonionic surfactant that may be used include polyalkylene oxide alkyl phenyl ether surfactants, polyalkylene oxide alkyl ether surfactants, polyethylene oxide-polypropylene oxide block copolymer surfactants, polyoxyalkylene distyrenated phenyl ether surfactants, polyalkylene tribenzyl phenyl ether surfactants and acetylene polyalkylene oxide surfactants.

Of these, a polyalkylene oxide (hereinafter abbreviated as "PAO") alkyl ether surfactant selected from the group consisting of PAO decyl ether, PAO lauryl ether, PAO tridecyl ether, PAO alkylene decyl ether, PAO sorbitan monolaurate, PAO sorbitan monooleate, PAO sorbitan monostearate, polyethylene oxide sorbitol tetraoleate, PAO alkylamine, and PAO acetylene glycol is preferred. The polyalkylene oxide is preferably a polyethylene oxide, polypropylene oxide or polybutylene oxide polymer.

A cationic surfactant is also preferably used in the present invention, because it is more excellent in both of the removability of the residues and the resistance to corrosion of the substrate and the dielectric film. Preferred examples of the cationic surfactant include a quaternary ammonium salt surfactant and an alkylpyridium surfactant.

A preferred example of the quaternary ammonium salt surfactant includes a compound represented by general formula (2):

General formula (2)

(wherein X⁻ represents a hydroxide ion, a chlorine ion, a bromine ion or a nitrate ion; $R_5$ represents an alkyl group having 8 to 18 carbon atoms; $R_6$ to $R_7$ each independently represent an alkyl group having 1 to 18 carbon atoms, an aryl group, a hydroxyalkyl group having 1 to 8 carbon atoms, or a benzyl group; and $R_8$ represents an alkyl group having 1 to 3 carbon atoms).

In general formula (2), X⁻ represents a counter anion and more specifically a hydroxide ion, a chlorine ion, a bromine ion or a nitrate ion.

In general formula (2), $R_5$ represents an alkyl group having 8 to 18 carbon atoms (and preferably 12 to 18 carbon atoms, for example a cetyl group or a stearyl group).

$R_6$ to $R_7$ each independently represent an alkyl group having 1 to 18 carbon atoms, a hydroxyalkyl group having 1 to 8 carbon atoms (e.g., hydroxyethyl), an aryl group (e.g., phenyl group) or a benzyl group.

In general formula (2), $R_8$ represents an alkyl group having 1 to 3 carbon atoms (e.g., methyl group or ethyl group).

Illustrative examples of the compound represented by general formula (2) include cetyl trimethyl ammonium chloride, didodecyl dimethyl ammonium chloride, tridecyl methyl ammonium chloride, and stearyl benzyl dimethyl ammonium chloride. The counter anion of these illustrated compounds is not limited to chlorine ion but may be bromine ion, hydroxide ion, or nitrate ion.

A specific example of the alkylpyridium surfactant includes cetylpyridinium chloride. The counter anion of these illustrated compounds is not limited to chlorine ion but may be bromine ion, hydroxide ion, or nitrate ion.

The surfactant is incorporated in the cleaning liquid in an amount of preferably 0.0001 to 5 wt % and more preferably 0.0001 to 1 wt % with respect to the total weight of the cleaning liquid. A surfactant content within the above-defined range is preferred because addition of the surfactant to the cleaning liquid enables its viscosity to be adjusted to improve the wettability of the liquid with respect to the object to be cleaned. This range is also preferred in terms of more excellent resistance to corrosion of the substrate and the dielectric film. In general, such surfactants are commercially available. These surfactants may be used singly or in combination of two or more.

(pH)

The cleaning liquid of the present invention has a pH of 10 to 14 and preferably 11 to 14. A pH within the above-defined range is preferred because the photoresist, antireflective film, etching residue and ashing residue can be thoroughly removed. The pH may be measured by using a known pH meter.

The cleaning liquid of the present invention preferably contains an alkaline compound to adjust the pH within the above-defined range. The alkaline compound refers to a compound which enables an aqueous solution containing it to show alkalinity. Specific examples thereof include an inorganic alkaline compound such as an alkali metal hydroxide composed of a pair of an alkali metal element and hydroxyl group and a quaternary ammonium hydroxide represented by general formula (1).

A preferred example of the inorganic alkaline compound includes an alkali metal hydroxide and more specifically it is preferred to use at least one alkali metal hydroxide selected from the group consisting of lithium hydroxide, sodium hydroxide, potassium hydroxide, rubidium hydroxide and cesium hydroxide. Of these, it is more preferred to use sodium hydroxide or potassium hydroxide in terms of handleability. Hydroxides of alkali metals or hydrates thereof may be used singly or in combination of two or more.

The quaternary ammonium hydroxide is a compound represented by general formula (1):

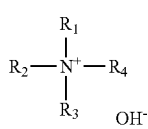

General formula (1)

(wherein $R_1$ to $R_4$ each independently represent an alkyl group having 1 to 6 carbon atoms, a hydroxyalkyl group having 1 to 6 carbon atoms, a benzyl group or an aryl group).

In general formula (1), $R_1$ to $R_4$ each independently represent an alkyl group having 1 to 6 carbon atoms (e.g., methyl group, ethyl group or butyl group), a hydroxyalkyl group having 1 to 6 carbon atoms (e.g., hydroxymethyl group, hydroxyethyl group or hydroxybutyl group), a benzyl group or an aryl group (e.g., phenyl group, naphthyl group or naphthalene group). Of these, alkyl groups, hydroxyethyl group and benzyl group are preferred.

Specifically, the compound represented by general formula (1) is preferably at least one quaternary ammonium hydroxide selected from the group consisting of tetramethyl ammonium hydroxide, tetraethyl ammonium hydroxide, trimethylhydroxyethylammonium hydroxide, methyl tri(hydroxyethyl)ammonium hydroxide, tetra(hydroxyethyl)ammonium hydroxide, trimethylbenzylammonium hydroxide and choline.

In the present invention, it is more preferred to use tetramethyl ammonium hydroxide, tetraethyl ammonium hydroxide, benzyltrimethylammonium hydroxide or choline. Tetraethyl ammonium hydroxide and choline are particularly preferred. The quaternary ammonium hydroxides may be used singly or in combination of two or more.

Two or more of the alkali metal hydroxides and two or more of the quaternary ammonium hydroxides may be used in combination.

The alkaline compound (e.g., inorganic alkaline compound or quaternary ammonium hydroxide represented by general formula (1)) is incorporated in the cleaning liquid of the present invention in an amount of preferably 0.01 to 20 wt %, more preferably 0.1 to 10 wt % and even more preferably 0.1 to 5 wt % with respect to the total weight of the cleaning liquid. An alkaline compound content within the above-defined numerical range is preferred because the photoresist, antireflective film, etching residue and ashing residue can be thoroughly removed while suppressing or reducing corrosion of the SiOC-based interlayer dielectric film and the silicon substrate.

(Others)

It is preferred for the cleaning liquid of the present invention to be an aqueous solution and to contain water in an amount of 50 to 98 wt % with respect to the total weight of the cleaning liquid. The heterocycle-containing metal corrosion inhibitor such as benzotriazole is preferably not used and is more preferably not substantially contained in the cleaning liquid of the present invention.

The cleaning liquid of the present invention may optionally contain a water-soluble organic solvent, a fluorine-containing compound and a chelating agent. The inclusion of these components enables further preferred performance to be obtained.

(Water-Soluble Organic Solvent)

The cleaning liquid of the present invention may contain a water-soluble organic solvent. Examples of the water-soluble organic solvent include alcoholic solvents such as methyl alcohol, ethyl alcohol, 1-propyl alcohol, 2-propyl alcohol, ethylene glycol, propylene glycol, glycerol, 1,6-hexanediol, sorbitol, and xylitol; ether solvents such as ethylene glycol monomethyl ether, diethylene glycol, diethylene glycol monomethyl ether, triethylene glycol, polyethylene glycol, and propylene glycol monomethyl ether; amide solvents such as formamide, monomethylformamide, dimethylformamide, acetamide, monomethylacetamide, dimethylacetamide, monoethylacetamide, diethylacetamide, and N-methylpyrrolidone; sulfur-containing solvents such as dimethyl sulfone, dimethyl sulfoxide, and sulfolane; and lactone solvents such as γ-butyrolactone, and δ-valerolactone.

Of these, alcoholic solvents, ether solvents, amide solvents and sulfur-containing solvents are preferred and 1,6-hexanediol, tetraethylene glycol, propylene glycol, dipropylene glycol monomethyl ether, N-methylpyrrolidone, and dimethyl sulfoxide are more preferred. The water-soluble organic solvents may be used singly or in combination of two or more.

It is particularly preferred for the cleaning liquid of the present invention to contain the ether solvent. Diethylene glycol, triethylene glycol, and polyethylene glycol (having in particular a molecular weight of 300 or less) are more particularly preferred. Even in a shortened period of time for rinsing with water following cleaning, more excellent residue removal properties are achieved by including the ether solvent.

The water-soluble organic solvent is used in the cleaning liquid at a concentration of preferably 0 to 40 wt %, more preferably 0 to 20 wt %, and most preferably 0.0001 to 0.5 wt % with respect to the total weight of the cleaning liquid. The addition of the water-soluble organic solvent to the cleaning liquid is preferred because the removal of the etching residue can be promoted.

(Fluorine-Containing Compound)

The cleaning liquid of the present invention may contain a fluorine-containing compound. The fluorine-containing compound is a fluoride salt produced by reacting hydrofluoric acid with ammonia or an organic amine. Examples of the fluorine-containing compound include ammonium fluoride, acidic ammonium fluoride, methylamine hydrofluoride, ethylamine fluoride, propylamine fluoride, tetramethyl ammonium fluoride, tetraethyl ammonium fluoride, ethanolamine hydrofluoride, and triethylenediamine hydrofluoride. These may be used singly or in combination of two or more.

The fluorine-containing compound is preferably used in the cleaning liquid at a concentration of 0 to 10 wt % with respect to the total weight of the cleaning liquid. The addition of the fluorine-containing compound to the cleaning liquid is preferred because the removal of the photoresist, antireflective film, etching residue and ashing residue can be promoted.

(Chelating Agent)

The cleaning liquid of the present invention may contain a chelating agent. Examples of the chelating agent include a group of aminopolycarboxylic acid salts {ethylenediaminetetraacetate (EDTA), diethylenetriaminepentaacetate (DTPA), hydroxyethylethylenediaminetriacetate (HEDTA), dihydroxyethylethylenediaminetetraacetate (DHEDDA), nitrilo triacetate (NTA), hydroxyethyliminodiacetate (HIDA), β-alanine diacetate, aspartic acid diacetate, methylglycine diacetate, iminodisuccinate, serine diacetate, hydroxyiminodisuccinate, dihydroxyethylglycine salt, aspartate, glutamate, etc.}; a group of hydroxycarboxylic acid salts {hydroxyacetate, tartrate, citrate, gluconate, etc.}; a group of cyclocarboxylic acid salts {pyromellitate, benzopolycarboxylate, cyclopentane tetracarboxylate, etc.}; a group of ether carboxylic acid salts {carboxymethyl tartronate, carboxymethyloxy succinate, oxydisuccinate, tartaric acid monosuccinate, tartaric acid disuccinate, etc.}; a group of other carboxylic acid salts {maleic acid derivative, oxalate, etc.}; a group of organic carboxylic acid (salt) polymers {acrylic polymers and copolymers (acrylic acid-allyl alcohol copolymer, acrylic acid-maleic acid copolymer, hydroxyacrylic acid polymer, polysaccharide-acrylic acid copolymer, etc.); a group of polyvalent carboxylic acid polymers and copolymers {polymers and copolymers of monomers such as maleic acid, itaconic acid, fumaric acid, tetramethylene-1,2-dicarboxylic acid, succinic acid, aspartic acid and glutamic acid}; glyoxylic acid polymers; a group of polysaccharides {starch, cellulose, amylose, pectin, carboxymethyl cellulose, etc.}; a group of phosphonic acid salts {methyl diphosphonic acid salt, aminotrismethylene phosphonic acid salt, ethylidene diphosphonic acid salt, 1-hydroxyethylidene-1,1-diphosphonic acid salt, ethylaminobismethylene phosphonic acid salt, ethylenediaminebismethylene phosphonic acid salt, ethylenediaminetetramethylene phosphonic acid salt, hexamethylenediaminetetramethylene phosphonic acid, propylenediaminetetramethylene phosphonic acid salt, diethylenetriaminepentamethylene phosphonic acid salt, triethylenetetraminehexamethylene phosphonic acid salt, tetraethylenepentamineheptamethylene phosphonic acid salt, etc}.

Exemplary salts of these compounds include ammonium salts and salts of alkanolamines (such as monoethanolamine and triethanolamine). These may be used singly or in combination of two or more.

The chelating agent is preferably used in the cleaning liquid at a concentration of 0 to 10 wt % with respect to the total weight of the cleaning liquid. The addition of the chelating agent to the cleaning liquid is preferred because the removal of the metal-containing residue can be promoted.

(Object to be Cleaned)

In the practice of the present invention, the semiconductor device to be cleaned has a semiconductor substrate made of a semiconductor wiring material such as silicon, amorphous silicon, polysilicon, silicon oxide, silicon nitride, copper, titanium, titanium-tungsten, titanium nitride, tungsten, tantalum, tantalum compound, chromium, chromium oxide, and aluminum, or a semiconductor compound such as gallium-arsenic, gallium-phosphorus, or indium-phosphorus; a printed substrate made of, for example, a polyimide resin, or a glass substrate for use in LCDs.

The cleaning liquid of the present invention may be advantageously used in semiconductor devices (e.g., semiconductor device substrates) having an interlayer dielectric film. The interlayer dielectric film preferably has a dielectric constant k of 3.0 or less and more preferably 2.6 or less and exemplary materials of the interlayer dielectric film include SiOC materials and organic polymers such as polyimide. Specific examples of the semiconductor device (semiconductor element) in which the cleaning liquid of the present invention may be used include boards for semiconductor devices such as integrated circuits (IC, LSI). Examples of the semiconductor device board include a monolayer board having metal wiring formed on a substrate surface, a multilayer wiring board having wiring formed on an interlayer dielectric film deposited on a substrate surface, and a multilayer wiring board further having a photoresist deposited thereon. The cleaning liquid of the present invention is capable of removing residues without corroding these materials (wiring material, interlayer dielectric film material).

(Cleaning Method)

The cleaning method of the present invention includes a step of preparing the cleaning liquid of the invention (cleaning liquid-preparing step) and a step of cleaning a semiconductor device with the resulting cleaning liquid to thereby remove the photoresist, antireflective film, etching residue and ashing residue.

The cleaning liquid of the present invention is not particularly limited for its preparation method. The cleaning liquid can be produced by thoroughly mixing in an agitator such as a mixer, for example, a reducing agent, a surfactant, and optionally used compounds such as an inorganic alkaline compound and a quaternary ammonium hydroxide. Exemplary methods that may be used include a method in which the components are mixed after adjustment to a preset pH and a method in which the components are mixed before adjustment to a preset pH.

The cleaning step may be carried out by any known method. Exemplary methods of bringing the photoresist or the like into contact with the cleaning liquid include immersion, spraying and a method using a single wafer cleaning system. More specific examples include a dipping method in which a semiconductor device (such as a semiconductor integrated circuit board) is dipped into a cleaning bath filled with the cleaning liquid, a spraying method in which a board is cleaned by spraying with the cleaning liquid, and a spinning method in which a board is rotated at high speed while the cleaning liquid is flowed from a nozzle over the board.

The temperature of the cleaning liquid used in the cleaning method of the present invention may be selected as appropriate depending on the method used, etching conditions and the object to be cleaned, and is preferably in a range of 15 to 100° C., more preferably 15 to 80° C., and even more preferably 20 to 55° C. A cleaning liquid temperature within the above-defined range is preferred, because removability of residues and resistance to corrosion of the substrate and the dielectric film are more excellent and the process can be carried out at low temperatures, thus requiring no special device.

The period of time for which the photoresist or the like is brought into contact with the cleaning liquid of the present invention is selected as appropriate for the cleaning method used, and is preferably from 30 seconds to 30 minutes, more preferably from 30 seconds to 10 minutes, and even more preferably from 30 seconds to 5 minutes. A period of time within the above-defined numerical range is preferred because the photoresist, antireflective film, etching residue and ashing residue can be thoroughly removed and the cleaning method is carried out in a short period of time.

In the cleaning method of the present invention, it is also preferred to remove the photoresist or the like by repeating the cleaning step using the cleaning liquid two or more times. Repeating the cleaning step two or more times is preferred because the photoresist or the like is removed with improved performance. The cleaning step can be repeated an arbitrary number of times up until the photoresist or the like is completely removed, but is preferably repeated once to three times and more preferably once to twice.

The cleaning method of the present invention may optionally use ultrasonic waves in combination in the cleaning step.

The semiconductor device may optionally be cleaned (rinsed) following the removal of the photoresist or the like from an object to be cleaned. Rinsing is preferably performed with water at room temperature, hot water at a temperature of about 50° C. or isopropanol. A pretreatment with a solution containing hydrogen peroxide is effective for the cleaning of the photoresist which has been progressively modified by etching, but is not always necessary in the present invention.

In the case of a substrate having on its surface wiring of a metal such as copper and an interlayer dielectric film, examples of the cleaning step using the cleaning liquid of the present invention include a cleaning step following chemical mechanical polishing (CMP) of a copper film, a cleaning step following perforation of the interlayer dielectric film on the wiring by dry etching, and a cleaning step following dry ashing of the photoresist.

In a preferred embodiment of the cleaning method according to the present invention, the foregoing cleaning treatment (cleaning step) is carried out following the dry etching step of the semiconductor device. More specifically, a desired semiconductor device is dry-etched and thereafter cleaned using the above-described cleaning liquid in order to remove the etching residue and the photoresist. In a general photolithographic technology, dry etching is followed by wet etching with a specific photoresist stripper or dry ashing in order to remove the photoresist. On the other hand, use of the cleaning liquid of the present invention enables the photoresist and the etching residue to be removed by the cleaning step following the dry etching step without carrying out the above-described treatment steps. Accordingly, without the dry ashing step, the interlayer dielectric film (in particular the low-k material) can be kept less damaged while achieving a simplified treatment step, a shortened semiconductor device-manufacturing time and a reduced manufacturing cost.

EXAMPLES

The present invention is described below more specifically by way of examples. However, the present invention should not be construed as being limited to the following examples.

A copper film, an SiOC interlayer dielectric film (low-k film with a k value of 2.6), an $SiO_2$ film (TEOS film), a metal hard mask (Ti or TiN), an antireflective film and a photoresist were successively deposited on a silicon substrate and dry etching was carried out using the photoresist having undergone the exposure and development for the mask to form via holes to thereby form a pattern wafer in which the copper film, the interlayer dielectric film, the metal hard mask, the antireflective film, and the photoresist were exposed at the inner wall surfaces of the via holes.

The cross-section of the pattern wafer was checked by a scanning electron microscope (SEM) and a residue was found to be formed on the via hole wall surface following etching.

Examples 1 to 11 and Comparative Examples 1 to 5

Subsequently, cleaning liquids 1 to 16 whose compositions are as shown in Table 1 were prepared (Emulgen available from Kao Corp. and Surfynol available from Nissin Chemical Industry Co., Ltd. which are illustrated surfactants are nonionic surfactants).

A section of the pattern wafer with a size of about 2 cm×2 cm was immersed in each solution adjusted to the temperature shown in Table 1 for the time period shown in Table 1. Then, the pattern wafer section was taken out, immediately rinsed with ultrapure water and dried with $N_2$. Following the immersion test, the cross-section and the surface of the pattern wafer section was observed by SEM and evaluated for the removability of the photoresist, antireflective film, and etching residue, and resistance to corrosion of copper, Ti, TiN, silicon substrate, $SiO_2$, and SiOC interlayer dielectric film according to the following evaluation criteria. It should be noted that the immersion test was carried out at an immersion temperature of 20 to 55° C. for an immersion time period of 1 minute to 20 minutes, which was followed by rinsing with water for 60 seconds or 30 seconds. The evaluation results of the removability and corrosion resistance are shown in Table 1.

The evaluation criteria are as follows:

(Removability)

A: The photoresist, antireflective film, and etching residue were completely removed.

B: The photoresist, antireflective film, and etching residue remained in a dissolved state.

C: The photoresist, antireflective film, and etching residue were hardly removed.

(Corrosion Resistance (1))

A: Corrosion of copper, Ti, TiN and silicon substrate did not occur at all.

B: At least one of materials including copper, Ti, TiN, and silicon substrate corroded slightly.

C: At least one of materials including copper, Ti, TiN, and silicon substrate corroded considerably.

(Corrosion Resistance (2))

A: Corrosion of $SiO_2$ and SiOC interlayer dielectric film did not occur at all.

B: $SiO_2$ and SiOC interlayer dielectric film corroded slightly.

C: $SiO_2$ and SiOC interlayer dielectric film corroded considerably.

It is desirable to get all A's in the evaluation of the removability and corrosion resistance and each section is desirably not rated C for practical use. It is further desirable to get A's in a treatment at a low temperature for a short period of time.

As shown in Table 1, there was no corrosion of copper, Ti, TiN, silicon substrate, $SiO_2$, and SiOC interlayer dielectric film in Examples 1 to 11 to which the cleaning liquid and the cleaning method of the present invention were applied, and these examples were excellent in the removability of the photoresist, antireflective film, and etching residue. The immersion temperature and the immersion time can be selected from a relatively wide range in the cleaning using the cleaning liquid of the present invention, and cleaning at a low temperature for a short period of time is possible. Corrosion of copper, Ti, TiN, silicon substrate, $SiO_2$, and SiOC interlayer dielectric film did not proceed even under forced conditions for the extension of the immersion time. In Examples 9 to 11 in which the cleaning liquid contained an ether solvent, the photoresist and other residue could be removed in a shorter period of time.

Comparative Examples 1 to 5 did not exhibit high removability and corrosion resistance although the immersion time and the immersion temperature were adjusted.

TABLE 1

| Solution No. | | | EX1 1 | EX2 2 | EX3 3 | EX4 4 | EX5 5 | EX6 6 | EX7 7 | EX8 8 | EX9 9 |
|---|---|---|---|---|---|---|---|---|---|---|---|
| Composition (wt %) | Alkaline compound | Sodium hydroxide | 2 | | | 1 | | | | | |
| | | Tetramethyl ammonium hydroxide | | 3.5 | | 5 | | | 0.4 | | 3.5 |
| | | Potassium hydroxide | | | | | | 2.6 | 0.1 | | |
| | | Tetraethyl ammonium hydroxide | | | | | | | | | |
| | | Tetrabutyl ammonium hydroxide | | | | | | | | | |
| | | Trimethylbenzyl-ammonium hydroxide | | | 0.8 | | 4 | | | 10 | |
| | Reducing agent | Hydroxylamine | 2 | | 5 | 2 | | 4 | | | |
| | | Diethylhydroxylamine | | 3 | | 2 | 4 | | 0.2 | 0.5 | 3 |
| | | Sodium sulfite | | | | | 1 | 0.5 | 0.2 | | |
| | Surfactant | $(C_3H_7)O(C_3H_6O)_3H$ | 0.05 | | | | 0.01 | | | 0.01 | |
| | | Emulgen LS-114 | | 0.05 | | | | | | 0.02 | |
| | | Emulgene A-90 | | | | | | 0.05 | 0.1 | | |
| | | Emulgen B-66 | | | | 0.01 | | | | | |
| | | Surfynol 465 | | | | | | 0.02 | | | |
| | | Cetyl trimethyl ammonium chloride | | | 0.03 | | 0.05 | 0.02 | 0.01 | 0.03 | 0.05 |
| | | Lauryl pyridinium chloride | | | | 0.05 | | | 0.05 | | |
| | | Sodium dodecylbenzene-sulfonate | | | | | 0.01 | | | | |
| | Water | | 95.95 | 90.45 | 94.17 | 89.93 | 90.69 | 82.86 | 98.94 | 86.44 | 93.35 |
| | Chelating agent | Diethylenetriamine-pentaacetate | | 3 | | | | | | 3 | |
| | Organic solvent | N-Methylpyrrolidone | | | | | | 10 | | | |
| | | Diethylene glycol | | | | | | | | | 0.1 |
| | | Triethylene glycol | | | | | | | | | |
| | Fluorine-containing compound | Ammonium fluoride | | | | | 0.2 | | | | |
| | Treatment condition | pH | 13.7 | 11.2 | 12.5 | 13.9 | 13.4 | 13.5 | 11.6 | 13.9 | 12.5 |
| | | Temperature (°C.) | 20 | 55 | 40 | 25 | 20 | 20 | 55 | 20 | 40 |
| | | Time (min) | 1 | 1 | 1 | 1 | 1 | 1 | 1 | 1 | 1 |
| | | Rinsing time (s) | 60/30 | 60/30 | 60/30 | 60/30 | 60/30 | 60/30 | 60/30 | 60/30 | 60/30 |
| Evaluation (rinsing time: 60 seconds) | | Removability of photoresist and other residue | A | A | A | A | A | A | A | A | A |
| | | Resistance to corrosion of copper, Ti, TiN and silicon substrate | A | A | A | A | A | A | A | A | A |
| | | Resistance to corrosion of $SiO_2$ and SiOC interlayer dielectric film | A | A | A | A | A | A | A | A | A |
| Evaluation (rinsing time: 30 seconds) | | Removability of photoresist and other residue | B | B | B | B | B | B | B | B | A |

| Solution No. | | | EX10 10 | EX11 11 | CE1 12 | CE2 13 | CE3 14 | CE4 15 | CE5 16 |
|---|---|---|---|---|---|---|---|---|---|
| Composition (wt %) | Alkaline compound | Sodium hydroxide | | | 1 | | | | |
| | | Tetramethyl ammonium hydroxide | | | | 2 | | 0.5 | |
| | | Potassium hydroxide | | | | | 2 | | |
| | | Tetraethyl ammonium hydroxide | 3.5 | | | | | | |
| | | Tetrabutyl ammonium hydroxide | | 3.5 | | | | | |
| | | Trimethylbenzyl-ammonium hydroxide | | | | | | | 0.5 |
| | Reducing agent | Hydroxylamine | | | 0.5 | | 1 | | |
| | | Diethylhydroxylamine | 3 | 3 | | | | | |
| | | Sodium sulfite | | | | 2 | | | |

TABLE 1-continued

| | | | | | | | | |
|---|---|---|---|---|---|---|---|---|
| Surfactant | $(C_3H_7)O(C_3H_6O)_3H$ | | | | | | | |
| | Emulgen LS-114 | 0.05 | | | | | | |
| | Emulgene A-90 | | | 0.01 | | | 0.02 | |
| | Emulgen B-66 | | | | | | | |
| | Surfynol 465 | | 0.05 | | | | | |
| | Cetyl trimethyl ammonium chloride | | | | | | 0.001 | |
| | Lauryl pyridinium chloride | | | | | | | 0.02 |
| | Sodium dodecylbenzene-sulfonate | | | 0.001 | 0.005 | | | |
| Water | | 93.35 | 92.95 | 96.489 | 95.995 | 97.00 | 97.479 | 78.48 |
| Chelating agent | Diethylenetriamine-pentaacetate | | | | 1 | | 1.5 | 1 |
| Organic solvent | N-Methylpyrrolidone | | | | | | | 20 |
| | Diethylene glycol | | | | | | | |
| | Triethylene glycol | 0.1 | 0.5 | | | | | |
| Fluorine-containing compound | Ammonium fluoride | | | | 1 | | | 0.5 |
| Treatment condition | pH | 12.5 | 12.5 | 6.1 | 13.1 | 13.4 | 12.7 | 2.5 |
| | Temperature (° C.) | 40 | 40 | 55 | 20 | 25 | 35 | 55 |
| | Time (min) | 1 | 1 | 20 | 1 | 1 | 5 | 20 |
| | Rinsing time (s) | 60/30 | 60/30 | 60/30 | 60/30 | 60/30 | 60/30 | 60/30 |
| Evaluation (rinsing time: 60 seconds) | Removability of photoresist and other residue | A | A | C | A | A | B | C |
| | Resistance to corrosion of copper, Ti, TiN and silicon substrate | A | A | A | C | A | C | A |
| | Resistance to corrosion of $SiO_2$ and SiOC interlayer dielectric film | A | A | A | C | C | A | B |
| Evaluation (rinsing time: 30 seconds) | Removability of photoresist and other residue | A | A | C | C | C | C | C |

What is claimed is:

1. A cleaning liquid for semiconductor devices comprising:
a reducing agent; and
a surfactant,
    wherein the cleaning liquid has a pH of 12.5 to 14, and
    wherein the surfactant is a cationic surfactant selected from the group consisting of a quaternary ammonium salt surfactant and an alkylpyridium surfactant.

2. The cleaning liquid for semiconductor devices according to claim 1, wherein the reducing agent is hydroxylamine or its derivative.

3. The cleaning liquid for semiconductor devices according to claim 1, wherein the reducing agent is at least one compound selected from the group consisting of dithionites, disulfites, sulfites, thiosulfates, dithionates, and trithionates.

4. The cleaning liquid for semiconductor devices according to claim 1, further comprising an inorganic alkaline compound or a quaternary ammonium hydroxide represented by general formula (1):

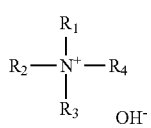

wherein $R_1$ to $R_4$ each independently represent an alkyl group having 1 to 6 carbon atoms, a hydroxyalkyl group having 1 to 6 carbon atoms, a benzyl group or an aryl group.

5. The cleaning liquid for semiconductor devices according to claim 4, wherein the inorganic alkaline compound is at least one compound selected from the group consisting of lithium hydroxide, sodium hydroxide, potassium hydroxide, rubidium hydroxide, and cesium hydroxide.

6. The cleaning liquid for semiconductor devices according to claim 4, wherein the quaternary ammonium salt surfactant is a compound represented by general formula (2):

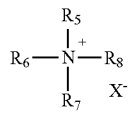

wherein $X^-$ represents a hydroxide ion, a chlorine ion, a bromine ion or a nitrate ion; $R_5$ represents an alkyl group having 8 to 18 carbon atoms; $R_6$ to $R_7$ each independently represent an alkyl group having 1 to 18 carbon atoms, an aryl group, a hydroxyalkyl group having 1 to 8 carbon atoms, or a benzyl group; and $R_8$ represents an alkyl group having 1 to 3 carbon atoms.

7. The cleaning liquid for semiconductor devices according to claim 1, further comprising a nonionic surfactant.

8. The cleaning liquid for semiconductor devices according to claim 7, wherein the nonionic surfactant is at least one selected from the group consisting of a polypropylene oxide polyethylene oxide surfactant, a polyalkylene oxide distyrenated phenyl ether surfactant, a polyalkylene oxide alkyl phenyl ether surfactant, a polyalkylene oxide tribenzyl phenyl ether surfactant, an acetylene polyalkylene oxide surfactant, and a polyalkylene oxide alkyl ether surfactant.

9. The cleaning liquid for semiconductor devices according to claim 1, wherein the cleaning liquid contains an ether solvent in an amount of 0.0001 to 0.5 wt % with respect to a total amount of the cleaning liquid.

10. The cleaning liquid for semiconductor devices according to claim 1, wherein the quaternary ammonium salt surfactant is a compound represented by general formula (2):

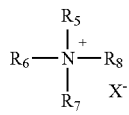

wherein $X^-$ represents a hydroxide ion, a chlorine ion, a bromine ion or a nitrate ion; $R_5$ represents an alkyl group having 8 to 18 carbon atoms; $R_6$ to $R_7$ each independently represent an alkyl group having 1 to 18 carbon atoms, an aryl group, a hydroxyalkyl group having 1 to 8 carbon atoms, or a benzyl group; and $R_8$ represents an alkyl group having 1 to 3 carbon atoms.

11. A semiconductor device-cleaning method comprising:
cleaning a semiconductor device using the cleaning liquid for semiconductor devices comprising:
a reducing agent; and
a surfactant, wherein the cleaning liquid has a pH of 12.5 to 14, and wherein the surfactant is a cationic surfactant selected from the group consisting of a quaternary ammonium salt surfactant and an alkylpyridium surfactant.

12. The semiconductor device-cleaning method according to claim 11, wherein the semiconductor device is one having an interlayer dielectric film with a dielectric constant k of 3.0 or less.

13. The semiconductor device-cleaning method according to claim 11, wherein the quaternary ammonium salt surfactant is a compound represented by general formula (2):

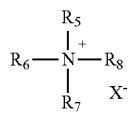

wherein $X^-$ represents a hydroxide ion, a chlorine ion, a bromine ion or a nitrate ion; $R_5$ represents an alkyl group having 8 to 18 carbon atoms; $R_6$ to $R_7$ each independently represent an alkyl group having 1 to 18 carbon atoms, an aryl group, a hydroxyalkyl group having 1 to 8 carbon atoms, or a benzyl group; and $R_8$ represents an alkyl group having 1 to 3 carbon atoms.

14. A semiconductor device-cleaning method comprising:
a cleaning step for cleaning a semiconductor device using a cleaning liquid for semiconductor devices comprising:
a reducing agent; and
a surfactant, wherein the cleaning liquid has a pH of 12.5 to 14, and wherein the surfactant is a cationic surfactant selected from the group consisting of a quaternary ammonium salt surfactant and an alkylpyridium surfactant after a dry etching step.

15. The semiconductor device-cleaning method according to claim 14, wherein the quaternary ammonium salt surfactant is a compound represented by general formula (2):

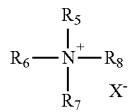

wherein $X^-$ represents a hydroxide ion, a chlorine ion, a bromine ion or a nitrate ion; $R_5$ represents an alkyl group having 8 to 18 carbon atoms; $R_6$ to $R_7$ each independently represent an alkyl group having 1 to 18 carbon atoms, an aryl group, a hydroxyalkyl group having 1 to 8 carbon atoms, or a benzyl group; and $R_8$ represents an alkyl group having 1 to 3 carbon atoms.

* * * * *